US011971298B1

United States Patent
Chen et al.

(10) Patent No.: US 11,971,298 B1
(45) Date of Patent: Apr. 30, 2024

(54) PIXEL CIRCUIT AND TEMPERATURE SENSING CIRCUIT ADJUSTING SIGNALS IN THE SAME

(71) Applicant: AUO Corporation, Hsin-Chu (TW)

(72) Inventors: Ming-Yao Chen, Hsin-Chu (TW); Chang-Hung Li, Hsin-Chu (TW); Shin-Shueh Chen, Hsin-Chu (TW); Jui-Chi Lo, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 0 days.

(21) Appl. No.: 18/065,648

(22) Filed: Dec. 14, 2022

(30) Foreign Application Priority Data

Oct. 26, 2022 (TW) .................................. 111140699

(51) Int. Cl.
| | |
|---|---|
| *G01J 1/44* | (2006.01) |
| *G01K 7/01* | (2006.01) |
| *H01L 27/146* | (2006.01) |
| *G06V 10/14* | (2022.01) |
| *G06V 40/13* | (2022.01) |
| *H04N 25/63* | (2023.01) |

(52) U.S. Cl.
CPC .................. *G01J 1/44* (2013.01); *G01K 7/01* (2013.01); *H01L 27/14612* (2013.01); *G01J 2001/444* (2013.01); *G01J 2001/446* (2013.01); *G06V 10/14* (2022.01); *G06V 40/1318* (2022.01); *H04N 25/63* (2023.01)

(58) Field of Classification Search
CPC .. G01J 1/44; G01J 2001/444; G01J 2001/446; G01K 7/01; H01L 27/14612; G06V 10/14; G06V 40/1318; H04N 25/63; H04N 25/75
See application file for complete search history.

(56) References Cited

U.S. PATENT DOCUMENTS

| | | | |
|---|---|---|---|
| 2006/0033697 A1* | 2/2006 | Yang | G09G 3/3648 345/101 |
| 2009/0050906 A1 | 2/2009 | Cho et al. | |
| 2012/0321149 A1* | 12/2012 | Carver | G06V 40/1318 382/124 |
| 2018/0266881 A1* | 9/2018 | Fujiwara | H01L 27/1443 |

FOREIGN PATENT DOCUMENTS

| | | | | |
|---|---|---|---|---|
| CN | 110595530 A | * | 12/2019 | ............. G01D 21/02 |
| DE | 69731419 T2 | * | 11/2005 | ............... H04N 5/32 |

* cited by examiner

Primary Examiner — Jennifer D Bennett
Assistant Examiner — Erin R Garber
(74) Attorney, Agent, or Firm — WPAT, P.C

(57) ABSTRACT

The present disclosure provides a sensing circuit, including a photo-sensing component, a first transistor, and a temperature-sensing component. The photo-sensing component is configured to receive a light and transmit a first current according to an intensity of the light. A gate terminal of the first transistor is configured to receive a first control circuit. The photo-sensing component and the first transistor are coupled in series between first and second nodes. The temperature-sensing component is coupled between the first and second nodes and is configured to generate a second current according to a temperature. The temperature-sensing component includes a channel structure, a first gate, a second gate, and a light-shielding structure. The channel structure is configured to transmit the second current.

20 Claims, 8 Drawing Sheets

PIXEL CIRCUIT AND TEMPERATURE SENSING CIRCUIT ADJUSTING SIGNALS IN THE SAME

CROSS-REFERENCE TO RELATED APPLICATION

This application claims priority to Taiwan Application Serial Number 111140699, filed Oct. 26, 2022, which are herein incorporated by reference in their entirety.

BACKGROUND

Field of Invention

The present disclosure relates to a sensing circuit and a pixel circuit. More particularly, the present disclosure relates to a sensing circuit and a pixel circuit including a photo-sensing component and a temperature-sensing component.

Description of Related Art

For most displays with fingerprint identification function currently on the market, the photo-sensing signal generated by the photo-sensing component is easily influenced by the environment temperature, and the accuracy of fingerprint imaging is affected as well. In order to use an external circuit to correct the photo-sensing signal according to the temperature, a temperature-sensing component is required for obtaining the temperature information of the pixels. However, because the temperature-sensing component cannot be shined by light, the existing photo-sensing component cannot be used as the temperature-sensing component.

SUMMARY

The present disclosure provides a sensing circuit, including a photo-sensing component, a first transistor, and a temperature-sensing component. The photo-sensing component is configured to receive a light and transmit a first current according to an intensity of the light. A gate terminal of the first transistor is configured to receive a first control circuit. The photo-sensing component and the first transistor are coupled in series between a first node and a second node. The temperature-sensing component is coupled between the first node and the second node and is configured to generate a second current according to a temperature. The temperature-sensing component includes a channel structure, a first gate, a second gate, and a light-shielding structure. The channel structure is configured to transmit the second current. The first gate is arranged above the channel structure and is configured to control the channel structure to operate in an off state according to a second control signal. The second gate is arranged below the channel structure and is configured to control an intensity of the second current in the channel structure according to a third control signal. The light-shielding structure is arranged above the first gate and is configured to shield the light coming from above the temperature-sensing component.

The present disclosure also provides a pixel circuit, including a sensing circuit. The sensing circuit includes a semiconductor device. The semiconductor device is coupled between a first node and a second node. The semiconductor device includes a channel structure, a first gate, a second gate, and a light-shielding structure. The channel structure is configured to transmit a first current. The first gate is arranged above the channel structure and is configured to control the channel structure to operate in an off state according to a first control signal. The second gate is arranged below the channel structure and is configured to control an intensity of the first current in the channel structure according to a second control signal. The light-shielding structure is arranged above the first gate and is configured to shield a light coming from above the semiconductor device. In response to the second gate controlling the first current in the channel structure to be relatively large, the semiconductor device is configured as a temperature-sensing component. In response to the second gate controlling the first current in the channel structure to be relatively small, the semiconductor device is configured as a switch component.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
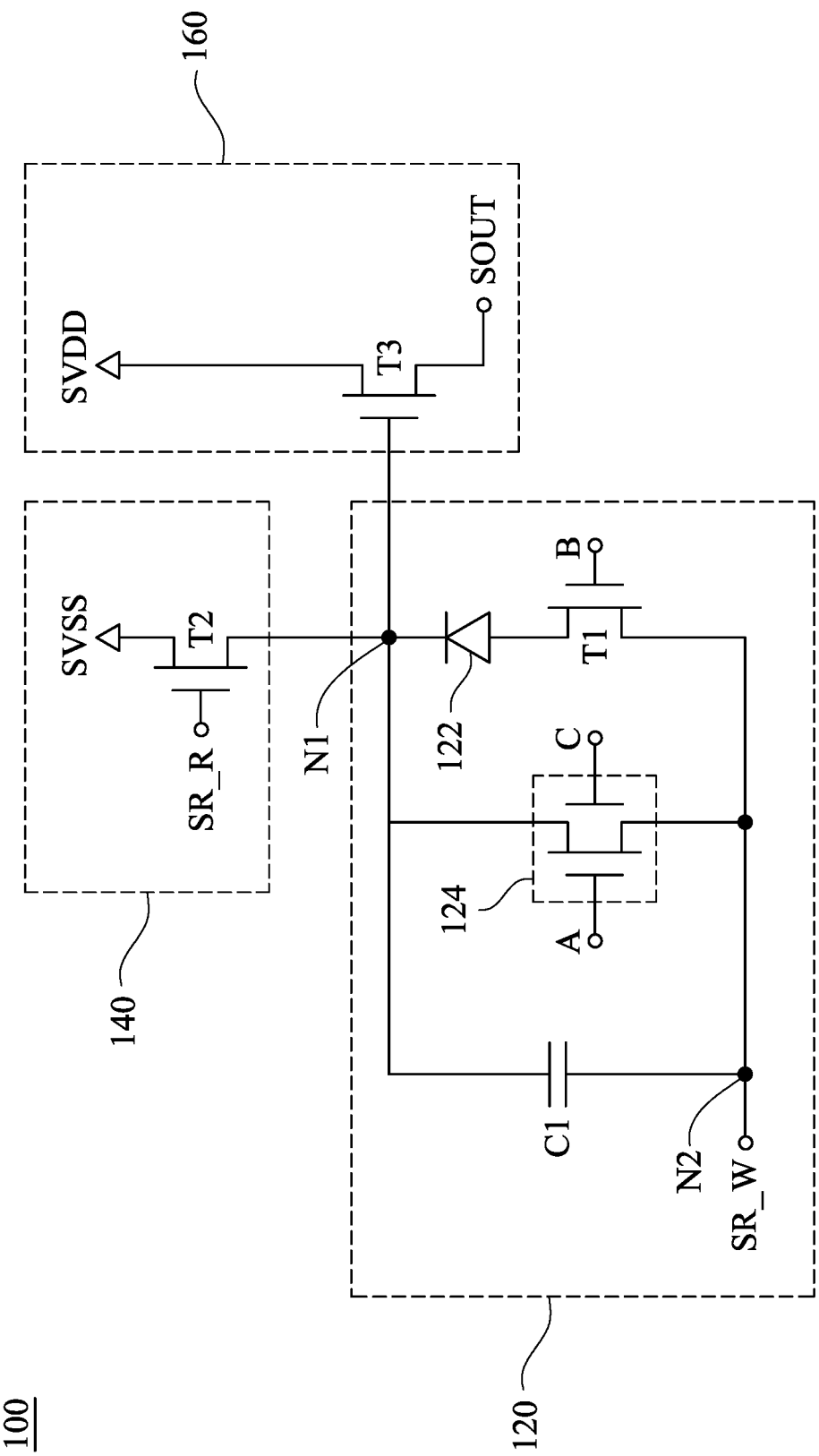
FIG. 1 is a circuit diagram of a pixel circuit in accordance with some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items. Moreover, it will be understood that, although the terms "first," "second," etc., may be used herein to describe various elements, these elements should not be limited by these terms. These terms are used to distinguish one element from another.

Some embodiments of the present disclosure provide a pixel circuit. Reference is now made to FIG. 1. FIG. 1 is a circuit diagram of a pixel circuit 100 in accordance with some embodiments of the present disclosure. The pixel circuit 100 includes a sensing circuit 120, a reset circuit 140, and a signal amplifying circuit 160. In some embodiments, the pixel circuit 100 generates a photo-sensing signal and a temperature-sensing signal through the sensing circuit 120, uses the signal amplifying circuit 160 to amplify and output the photo-sensing signal and the temperature-sensing signal, and resets the sensing circuit 120 through the reset circuit 140 after the sensing is complete and/or when the pixel circuit 100 is ready for sensing.

For illustration of FIG. 1, the sensing circuit 120 is coupled between a node N1 and a node N2. The reset circuit 140 is coupled between a reference voltage terminal and the node N1, and the reference voltage terminal is configured to provide a reference voltage SVSS. The signal amplifying circuit 160 is coupled between a reference voltage terminal and the node N1, and the reference voltage terminal is configured to provide a reference voltage SVDD.

For illustration of FIG. 1, the sensing circuit 120 includes a photo-sensing component 122, a transistor T1, a semiconductor device 124, and a capacitor C1. The photo-sensing component 122 and the transistor T1 are coupled in series between the node N1 and the node N2. The semiconductor device 124 is coupled between the node N1 and the node N2. The capacitor C1 is coupled between the node N1 and the node N2. Alternatively stated, the photo-sensing component 122 and the transistor T1 that are coupled in series, the semiconductor device 124, and the capacitor C1 are coupled in parallel with each other between the node N1 and the node N2.

In some embodiments, the photo-sensing component 122 is configured to receive a light and transmit a current according to an intensity of the received light. In some embodiments, when the light received by the photo-sensing component 122 has a relatively high intensity, the photo-sensing component 122 is configured to transmit a relatively large current. When the light received by the photo-sensing component 122 has a relatively low intensity, the photo-sensing component 122 is configured to transmit a relatively small current.

In some embodiments, the current that the photo-sensing component 122 generates when receiving light with high intensity is referred to as photocurrent. The current that the photo-sensing component 122 generates when not receiving light is referred to as dark current. In some embodiments, the photocurrent is larger than the dark current if the voltage applied across the photo-sensing component 122, the environment temperature, and other conditions do not change.

In some embodiments, the photo-sensing component 122 is configured to implement the fingerprint identification function of a display. The display having fingerprint identification function includes multiple pixel circuits 100 and a backlight module (not shown in FIG. 1). In order to perform fingerprint identification, first, the backlight module of the display emits light to the user's finger. When the light is reflected back from the user's finger, the photo-sensing component 122 of the pixel circuit 100 receives the reflected light. Because the user's fingerprint includes ridges and valleys, and the lights reflected from the ridges and the valleys reflect have different intensities, the photo-sensing component 122 corresponding to the valleys and the photo-sensing component 122 corresponding to the ridges will generate larger photocurrents and smaller dark currents respectively. In some embodiments, the display further includes an integrated circuit configured to create the user's fingerprint according to the ratio and/or difference of the photocurrents and the dark currents mentioned above.

In some embodiments, when the environment temperature of the photo-sensing component 122 rises, the photocurrent and the dark current generated by the photo-sensing component 122 increase as well. The increase ratios of the photocurrent and the dark current are different, and thus the accuracy of fingerprint identification is affected. The pixel circuit 100 uses the semiconductor device 124 in the sensing circuit 120 to sense the environment temperature and transmits an environment temperature signal to the integrated circuit. The integrated circuit corrects or adjusts the current generated by the photo-sensing component 122 according to the environment temperature signal.

In some embodiments, the photo-sensing component 122 is a silicon-rich oxide (SRO) photo-sensing component.

For illustration of FIG. 1, a first terminal of the transistor T1 is coupled to a second terminal of the photo-sensing component 122, a second terminal of the transistor T1 is coupled to the node N2, and a gate terminal of the transistor T1 is configured to receive a control signal B.

In some embodiments, the transistor T1 is a p-type metal-oxide-semiconductor (PMOS) transistor. A gate terminal of the transistor T1 is configured to receive the control signal B. When the control signal B has a voltage level corresponding to logic low, the transistor T1 is turned on. When the control signal B has a voltage level corresponding to logic high, the transistor T1 is turned off.

For illustration of FIG. 1, the semiconductor device 124 has two gates, and the two gates are configured to receive a control signal A and a control signal C respectively. By applying voltages to the two gates of the semiconductor device 124, the semiconductor device 124 can be controlled to operate in an on state or in an off state.

In some embodiments, the semiconductor device 124 has an N-type channel. When the control signal A has a voltage level corresponding to logic low, the semiconductor device 124 operates in the off state. When the control signal A has a voltage level corresponding to logic high, the semiconductor device 124 operates in the on state.

In some embodiments, the semiconductor device 124 operates in the off state during a photo-sensing period and a temperature-sensing period. When the semiconductor device 124 operates in the off state, there is still a current passing through the semiconductor device 124. In some embodiments, by applying the control signal C to the other gate of the semiconductor device 124 and changing the voltage level of the control signal C, the intensity of the current mentioned above can be controlled.

Figure 2:
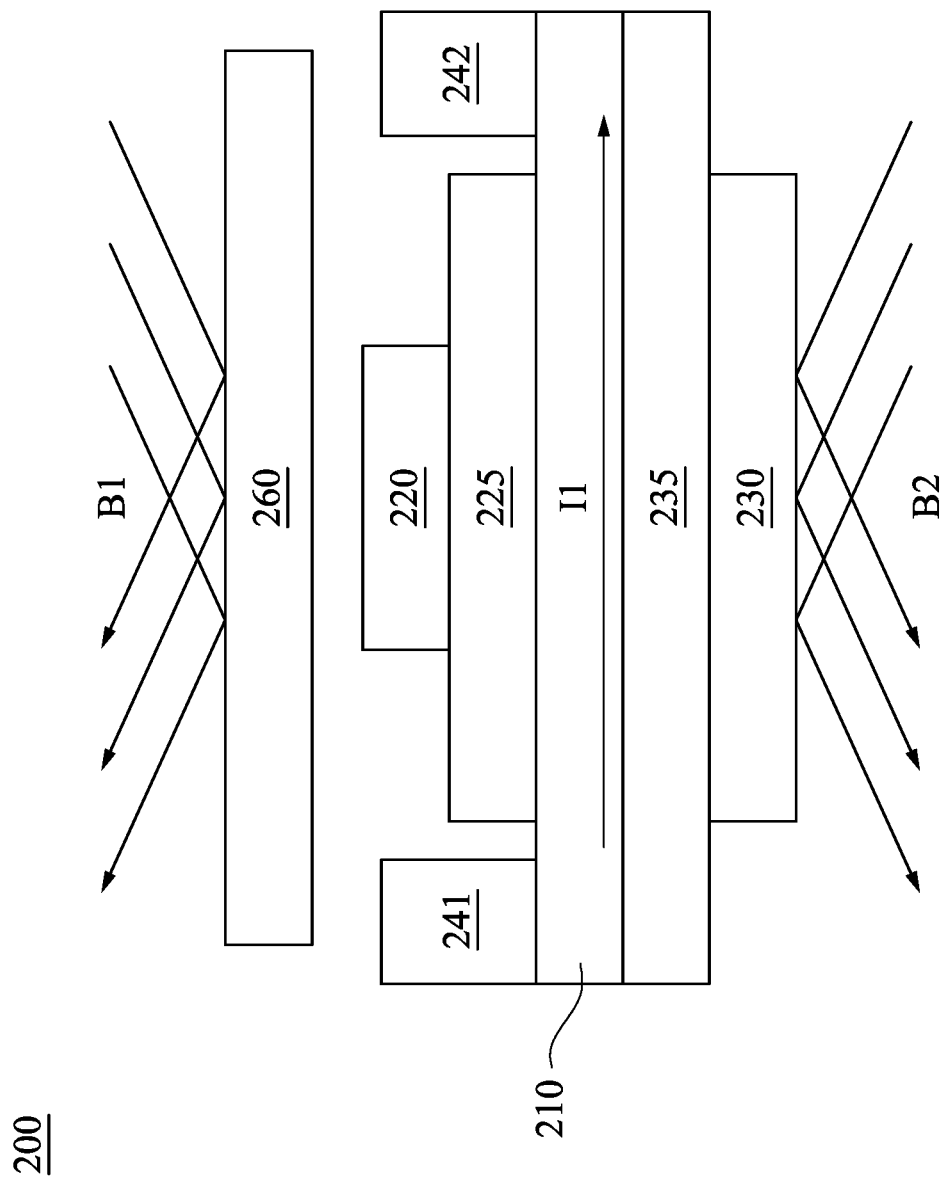
FIG. 2 is a diagram of a semiconductor device in accordance with some embodiments of the present disclosure.

In some embodiments, the semiconductor device 124 has a structure such as a semiconductor device 200 as shown in FIG. 2. Reference is now made to FIG. 2. FIG. 2 is a diagram of the semiconductor device 200 in accordance with some embodiments of the present disclosure. The semiconductor device 200 includes a channel structure 210, a gate 220, an isolation structure 225, a gate 230, an isolation structure 235, conductive structures 241-242, and a light-shielding structure 260.

For illustration of FIG. 2, the gate 220, the isolation structure 225, the channel structure 210, the isolation structure 235, and the gate 230 are stacked from top to bottom in a sequential order. The gate 220 is arranged above the channel structure 210, and the isolation structure 225 is arranged between the gate 220 and the channel structure 210. The gate 230 is arranged below the channel structure 210, and the isolation structure 235 is arranged between the gate 230 and the channel structure 210.

In some embodiments, the gate 220 is configured to receive a control signal to control the channel structure 210 to operate in the on state or in the off state. When the gate 220 receives the control signal, an electric field forms between the gate 220 and the channel structure 210 and across the isolation structure 225, so that the carriers in the channel structures 210, including, for example, electrons and holes, are subject to the electric field and move. Accordingly, the channel structure 210 can be controlled to operate in the on state or in the off state.

In some embodiments, the gate 230 is configured to receive a control signal to control an intensity of a current I1 in the channel structure 210. When the gate 230 receives the control signal, an electric field forms between the gate 230 and the channel structure 210 and across the isolation structure 235.

In some embodiments, the gate 220 of the semiconductor device 200 corresponds to the gate of the semiconductor device 124 configured to receive the control signal A, as shown in FIG. 1. The gate 230 of the semiconductor device 200 corresponds to the gate of the semiconductor device 124 configured to receive the control signal C, as shown in FIG. 1.

In some embodiments, the gate 220 is configured to receive a control signal, for example, the control signal A as shown in FIG. 1, and control the channel structure 210 to operate in the off state according to the control signal. The gate 230 is configured to receive a control signal, for example, the control signal C as shown in FIG. 1, and control the intensity of the current I1 in the channel structure 210 according to the control signal.

In some embodiments, the gate 220 of the semiconductor device 200 is referred to as a top gate, and the gate 230 of the semiconductor device 200 is referred to as a bottom gate. The semiconductor device 200 is referred to as a protrusion-gate low temperature poly-silicon (LTPS) thin-film transistor (TFT).

In some embodiments, the channel structure 210 includes dopants, and carriers such as electrons or holes are filled in the channel structure 210. Due to the electric field formed by the gate 220 and/or the gate 230, a channel forms in the channel structure 210. When there is a voltage difference between the left end and the right end of the channel structure 210, the channel structure 210 is configured to transmit the current I1.

For illustration of FIG. 2, the conductive structures 241-242 are coupled to the left end and the right end of the channel structure 210 respectively. In some embodiments, the conductive structure 241 receives a relatively high voltage, and the conductive structure 242 receives a relatively low voltage. The current I1 is transmitted from the conductive structure 241 to the channel structure 210, and then from the channel structure 210 to the conductive structure 242.

In some embodiments, the conductive structure 241 is referred to as a source terminal of the semiconductor device 200, and the conductive structure 242 is referred to as a drain terminal of the semiconductor device 200.

For illustration of FIG. 2, the light-shielding structure 260 is arranged above the gate 220 and is configured to shield a light B1 coming from above the semiconductor device 200.

In some approaches, the semiconductor device 200 does not have the light-shielding structure 260. The light B1 passes through the isolation structure 225 and shines on the channel structure 210. Thus, the intensity of the current I1 in the channel structure 210 is affected.

In some embodiments, the light-shielding structure 260 arranged above the semiconductor device 200 is configured to prevent the intensity of the current I1 in the channel structure 210 from being affected by the light B1.

For illustration of FIG. 2, the gate 230 has a relatively large width, and the gate 220 has a relatively small width. The wider gate 230 is able to prevent the light B2 that comes from below the semiconductor device 200 from passing through the isolation structure 235, shining on the channel structure 210, and affecting the intensity of the current I1 in the channel structure 210.

Figure 3:
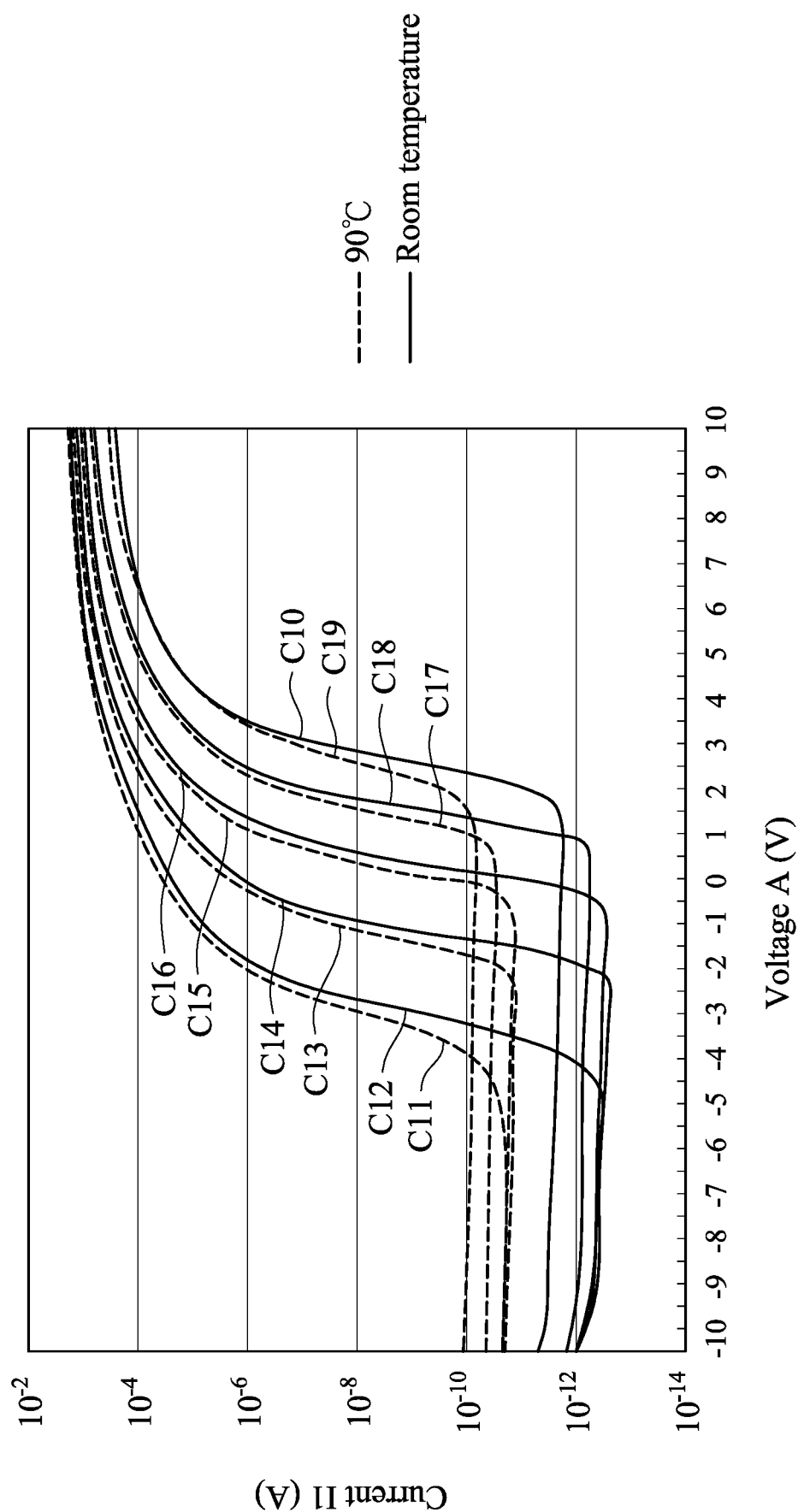
FIG. 3 is a diagram illustrating a current-voltage relationship for the semiconductor devices as shown in FIGS. 1 and 2 in accordance with some embodiments of the present disclosure.

In some embodiments, each of the semiconductor devices 124 and 200 shown in FIGS. 1-2 has a current-voltage relationship such as the one shown in FIG. 3. FIG. 3 is a diagram illustrating a current-voltage relationship for the semiconductor devices 124 and 200 as shown in FIGS. 1 and 2 in accordance with some embodiments of the present disclosure. The vertical axis in FIG. 3 is the current I1 of the semiconductor device 200, and the horizontal axis in FIG. 3 is the voltage level of the control signal that the gate 220 of the semiconductor device 200 receives. This control signal corresponds to the control signal A that the semiconductor device 124 receives, as shown in FIG. 1.

For illustration of FIG. 3, dashed lines indicate the current-voltage relationships of the semiconductor device 200 when it operates at 90° C., and solid lines indicate the current-voltage relationships of the semiconductor device 200 when it operates at room temperature. In some embodiments, the room temperature is around 20° C.~30° C.

In some embodiments, each pair of the curves shown in FIG. 3 corresponds to a voltage level of the control signal C that the gate 230 of the semiconductor device 200 receives. The curves C11-C12 corresponds to the voltage level of the control signal C being 10 V, the curves C13-C14 corresponds to the voltage level of the control signal C being 5 V, the curves C15-C16 corresponds to the voltage level of the control signal C being 0 V, the curves C17-C18 corresponds to the voltage level of the control signal C being −5 V, and the curves C19-C10 corresponds to the voltage level of the control signal C being −10 V.

For illustration of FIG. 3, when the semiconductor device 200 operates at a certain operating temperature and operates in the off state, in response to the voltage level of the control signal C that the gate 230 receives being negative, the current I1 of the channel structure 210 is relatively large; in response to the voltage level of the control signal C that the gate 230 receives being positive, the current I1 of the channel structure 210 is relatively small. For example, when the temperature is 90° C. and the gate 220 receives the control signal having a voltage level of −8.5 V, as shown by the curves C19, C17, C15, C13, and C11, the current I1 of the channel structure 210 has the highest intensity in response to the control signal C having a voltage level of −10 V, the current I1 of the channel structure 210 has the second highest intensity in response to the control signal C having a voltage level of −5 V, the current I1 of the channel structure 210 has the medium intensity in response to the control signal C having a voltage level of 0 V, the current I1 of the channel structure 210 has the second lowest intensity in response to the control signal C having a voltage level of 5 V, and the current I1 of the channel structure 210 has the lowest intensity in response to the control signal C having a voltage level of 10 V.

Similarly, when the semiconductor device 200 operates at the room temperature and operates in the off state, as shown by the curves C10, C18, C16, C14, and C12, in response to the voltage level of the control signal C that the gate 230 receives being negative, the current I1 of the channel structure 210 is relatively large; in response to the voltage level of the control signal C that the gate 230 receives being positive, the current I1 of the channel structure 210 is relatively small. For example, the current I1 of the channel structure 210 has the highest intensity in response to the control signal C having a voltage level of −10 V, and the current I1 of the channel structure 210 has the lowest intensity in response to the control signal C having a voltage level of 10 V.

For illustration of FIG. 3, if the semiconductor device 200 operates in the off state, the channel structure 210 has a larger current I1 when the temperature is at 90° C., compared with the situation where the temperature is at room temperature. For example, when the control signal received by the gate 230 has a voltage level of 10V, as shown by the curves C11-C12, the channel structure 210 has a larger current I1 when the temperature is at 90° C., compared with the situation where the temperature is at room temperature. When the control signal received by the gate 230 has a voltage level other than 10V, similarly, the current I1 increases when the temperature rises. Accordingly, the semiconductor device 200 is able to be used as a temperature-sensing component through the relationship between temperature and current as discussed above.

It is worth noting that the current-voltage relationships in FIG. 3 that the semiconductor device 200 has when operating at 90° C. and the room temperature are merely exemplary. When the semiconductor device 200 operates at a different temperature, the current and voltage of the semiconductor device 200 will have a relationship similar to the ones shown in FIG. 3. For example, when the temperature is larger than 90° C., the curves indicating the current-voltage relationship of the semiconductor device 200 will correspond to larger currents, compared with the dashed lines in FIG. 3. When the temperature is smaller than the room temperature, the curves indicating the current-voltage relationship of the semiconductor device 200 will correspond to smaller currents, compared with the solid lines in FIG. 3.

Reference is made to FIG. 1 again. As discussed in previous embodiments, the semiconductor device 124 has a larger current when the temperature rises. The semiconductor device 124 in the pixel circuit 100 is thus configured to generate a current according to the temperature. When the semiconductor device 124 operates at a relatively high temperature, the semiconductor device 124 has a relatively large current; when the semiconductor device 124 operates at a relatively low temperature, the semiconductor device 124 has a relatively small current.

In addition, as discussed in previous embodiments, the semiconductor device 124 has a relatively large current when the voltage level of the control signal C is negative, and the semiconductor device 124 has a relatively small current when the voltage level of the control signal C is positive.

In some embodiments, by applying the control signal C having a negative voltage level, the semiconductor device 124 has a relatively large current, and the semiconductor device 124 is configured as a temperature-sensing component. When the semiconductor device 124 has a relatively large current, because the semiconductor device 124 is coupled to the node N1, the current of the semiconductor device 124 has a relatively large influence on the voltage level of the node N1 during a certain time period. The voltage level of the node N1 is suitable for being configured as a temperature-sensing signal.

In some embodiments, by applying the control signal C having a positive voltage level, the semiconductor device 124 has a relatively small current, and the semiconductor device 124 is configured as a switch component. When the semiconductor device 124 has a relatively small current, such current is relatively small compared with the current that the photo-sensing component 122 generates when receiving light. Thus, the semiconductor device 124 only generates minimal current and is considered as a switch component that is turned off, and the influence that the semiconductor device 124 has on the voltage level of the node N1 during a certain time period can be ignored.

In some embodiments, the pixel circuit 100 operates in the photo-sensing period and the temperature-sensing period to obtain the photo-sensing signal and the temperature-sensing signal of the pixel circuit 100 respectively. During the photo-sensing period, the transistor T1 is turned on, and the current that the photo-sensing component 122 generates when receiving light is transmitted between the nodes N1-N2. When the current is transmitted between the nodes N1-N2, the voltage level of the node N1 changes due to the moving of charges. During a certain time period, if the current that the photo-sensing component 122 generates is constant, the voltage level of the node N1 has a certain level change, and thus the voltage level of the node N1 is configured to indicate the intensity of the light that the photo-sensing component 122 receives and is configured as the photo-sensing signal. The gate of the transistor T3 in the signal amplifying circuit 160 receives the voltage level of the node N1, and the voltage level of the node N1 determines the level to which the transistor T3 is turned on. The transistor T3 is configured to generate the output signal SOUT according to the reference voltage SVDD that its first terminal receives and the voltage level of the node N1. Accordingly, the photo-sensing signal represented by the voltage level of the node N1 is amplified by the signal amplifying circuit 160 and is output as the output signal SOUT.

In some embodiments, during the photo-sensing period, the semiconductor device 124 operates in the off state because receiving the control signal A with low voltage level, and the current of the semiconductor device 124 is controlled by the control signal C to have a relatively low intensity. Thus, compared with the current that the photo-sensing component 122 generates when receiving light during the photo-sensing period, the current generated by the semiconductor device 124 is minimal and can be ignored, the voltage level of the node N1 thus indicates the intensity of the light that the photo-sensing component 122 receives and is used as the photo-sensing signal.

In some embodiments, during the temperature-sensing period, the transistor T1 is turned off, and the current generated by the photo-sensing component 122 will not be transmitted between the nodes N1-N2. During this period, the semiconductor device 124 operates in the off state because receiving the control signal A with low voltage level, and the current of the semiconductor device 124 is controlled by the control signal C to have a relatively high intensity. When the current of the semiconductor device 124 is transmitted between the nodes N1-N2, the voltage level of the node N1 changes due to the moving of charges. During a certain time period, if the semiconductor device 124 has a constant current, the voltage level of the node N1 will have a certain level change, and the voltage level of the node N1 thus indicates the operating temperature of the semiconductor device 124 and is used as the temperature-sensing signal.

Reference is made to FIG. 2 again. Based on the above discussion, during the temperature-sensing period, the gate 230 controls the channel structure 210 to have a relatively large current I1, and the semiconductor device 200 is configured as the temperature-sensing component; during the photo-sensing period, the gate 230 controls the channel structure 210 to have a relatively small current I1, and the semiconductor device 200 is configured as the switch component.

Figure 4:
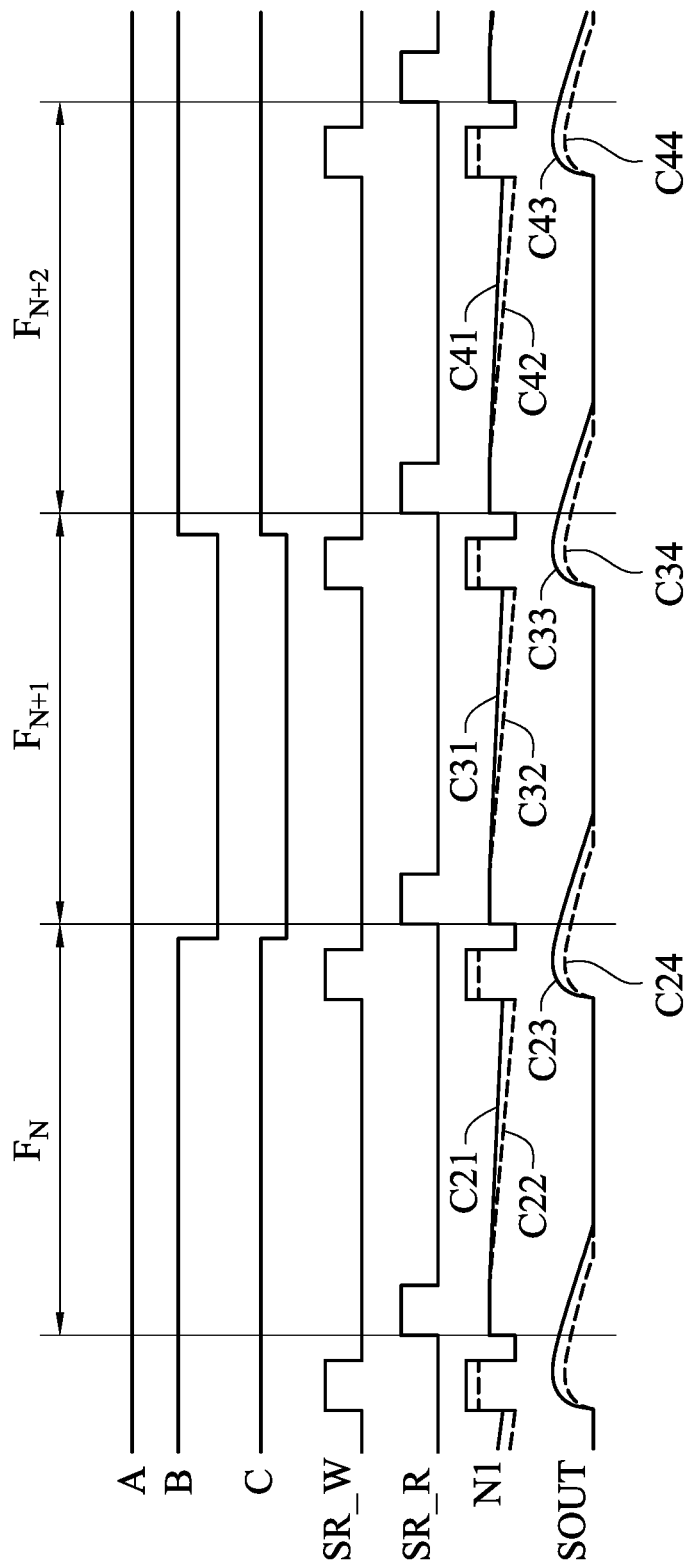
FIG. 4 is a sequence diagram for signals of the pixel circuit as shown in FIG. 1 in accordance with some embodiments of the present disclosure.

Reference is now made to FIGS. 1 and 4. FIG. 4 is a sequence diagram for signals of the pixel circuit 100 as shown in FIG. 1 in accordance with some embodiments of the present disclosure. The pixel circuit 100 operates in frames $F_N$, $F_{N+1}$, and $F_{N+2}$ in a sequential order. Voltage levels of the control signals A, B, C, SR_W, SR_R, the node N1, and the output signal SOUT in different frames are illustrated in FIG. 4.

In some embodiments, during the frame $F_N$, the pixel circuit 100 operates in the photo-sensing period. During this period, as shown in FIG. 4, the control signal A has a voltage level corresponding to logic low, the control signal B has a voltage level corresponding to logic high, and the control signal C has a voltage level corresponding to logic high. Accordingly, the transistor T1 is turned on so that the current generated by the photo-sensing component 122 can be transmitted to the node N1, and the gate of the semiconductor device 124 controls the channel of the semiconductor device 124 to have a relatively small current according to the control signal C having a relatively high voltage level.

Following the embodiments above, during the frame $F_N$, when the control signal SR_R has a high logic level, the transistor T2 is turned on and is configured to transmit the reference voltage SVSS to the node N1 and the first terminal of the capacitor C1. Accordingly, the transistor T2 in the reset circuit 140 resets the voltage level of the node N1 according to the reference voltage SVSS, so that the node N1 has the same voltage level as the reference voltage SVSS. In addition, the transistor T2 charges the capacitor C1 according to the reference voltage SVSS.

Following the embodiments above, during the frame $F_N$, after the reset circuit 140 resets the voltage level of the node N1, as shown by curves C21-C22, the voltage level of the node N1 starts to decrease slowly. The curve C21 indicates the change of the voltage level of the node N1 when the photo-sensing component 122 receives the light with relatively low intensity, and the curve C22 indicates the change of the voltage level of the node N1 when the photo-sensing component 122 receives the light with relatively high intensity. As described in previous embodiments, the photo-sensing component 122 generates current when receiving light. Because the transistor T1 is turned on, the voltage level of the node N1 decreases toward the voltage level of the control signal SR_W due to the moving of charges. Because the control signal SR_W has a relatively low voltage level, the curves C21-C22 both fall gradually.

Following the embodiments above, as shown in FIG. 4, during the frame $F_N$, the curve C22 falls at a relatively high speed and has a relatively large decrease, and the curve C21 falls at a relatively low speed and has a relatively small decrease. As discussed in previous embodiments, the curve C22 corresponds to a larger current of the photo-sensing component 122, and the curve C21 corresponds to a smaller current of the photo-sensing component 122. The larger current indicates that the charges move with a higher speed, so when the current of the photo-sensing component 122 is larger, the voltage level of the node N1 will decrease toward the voltage level of the control signal SR_W faster. Thus, the curves C21-C22 have the difference as discussed above and in FIG. 4.

Following the embodiments above, during the frame $F_N$, after the voltage level of the node N1 falls for a certain period, the voltage level of the control signal SR_W is raised from logic low to logic high. Because the two terminals of the capacitor C1 are coupled to the nodes N1-N2 respectively, when the control signal SR_W at the node N2 is raised, the voltage level of the node N1 will be raised as well. Accordingly, as shown in FIG. 4, when the control signal SR_W is logic high, the node N1 has a voltage level corresponding to logic high too. In some embodiments, as shown by the curves C21-C22, because the voltage levels at the node N1 fall to different levels according to the intensities of the current generated by the photo-sensing component 122, when the voltage levels at the node N1 are raised because the control signal SR_W is raised, the voltage levels at the node N1 will be raised to different levels.

Following the embodiments above, when the voltage levels at the node N1 are raised to the levels shown by the curves C21-C22, the voltage level of the node N1 turns on the transistor T3, and the transistor T3 is configured to generated the output signal SOUT according to the reference voltage SVDD and the voltage level of the node N1. As shown by the curves C21-C22, because the voltage levels at the node N1 are raised to different levels at different light intensities, the transistor T3 is turned on to different level, so that the output signal SOUT generated by the transistor T3 will also change according to the intensity of the light. The curve C23 corresponds to the curve C21 and a relatively low intensity of light, and the curve C24 corresponds to the curve C22 and a relatively high intensity of light. The pixel circuit 100 can use an additional integrated circuit to obtain information regarding the intensity of the light that the photo-sensing component 122 receives according to the output signals SOUT as shown by the curves C23-C24.

In some embodiments, during the frame $F_{N+1}$, the pixel circuit 100 operates in the temperature-sensing period. During this period, as shown in FIG. 4, the control signal A has a voltage level corresponding to logic low, the control signal B has a voltage level corresponding to logic low, and the control signal C has a voltage level corresponding to logic low. Accordingly, the transistor T1 is turned off so that the current generated by the photo-sensing component 122 cannot be transmitted to the node N1, and gate of the semiconductor device 124 controls the channel of the semiconductor device 124 to have a relatively large current according to the control signal C having a relatively low voltage level. Alternatively stated, by changing the voltage level of the control signal C, the semiconductor device 124 has a larger current during the temperature-sensing period than during the photo-sensing period.

For illustration of FIG. 4, the control signals SR_W and SR_R have similar time sequence diagrams during the frames $F_N$ and $F_{N+1}$. Accordingly, similar to the previous embodiments, when the control signal SR_R is logic high, the transistor T2 resets the signal at the node N1 according to the reference voltage SVSS. When the control signal SR_W is raised to logic high, the voltage level of the node N1 is raised as well.

Following the embodiments above, different from the frame $F_N$, during the frame $F_{N+1}$, the voltage level of the node N1 falls slowly because the current of the semiconductor device 124 is transmitted between the nodes N1-N2. The curve C31 indicates the change of the voltage level of the node N1 when the semiconductor device 124 operates at a relatively low temperature, and the curve C32 indicates the change of the voltage level of the node N1 when the semiconductor device 124 operates at a relatively high temperature. As discussed in the previous embodiments of FIGS. 2-3, the semiconductor device 124 has a larger current when operating in a higher temperature. The curve C32 corresponds to a higher temperature, and the larger current causes the voltage level of the node N1 to fall toward the voltage level of the control signal SR_W at a higher speed. The curve C31 corresponds to a lower temperature, and the smaller current causes the voltage level of the node N1 to fall toward the voltage level of the control signal SR_W at a lower speed.

Following the embodiments above, during the frame $F_{N+1}$, after the voltage level of the node N1 falls for a certain period, the voltage level of the control signal SR_W is raised from logic low to logic high, and the voltage level of the node N1 will be raised as well. In some embodiments, as shown by the curves C31-C32, because the voltage levels at the node N1 fall to different levels according to the intensities of the current of the semiconductor device 124 before being raised, when the voltage levels at the node N1 are raised because the control signal SR_W is raised, the voltage levels at the node N1 will be raised to different levels.

Following the embodiments above, when the voltage levels at the node N1 are raised to the levels shown by the curves C31-C32, the voltage level of the node N1 turns on the transistor T3, and the transistor T3 is configured to generate the output signal SOUT according to the reference voltage SVDD and the voltage level of the node N1. As shown by the curves C31-C32, because the voltage levels at the node N1 are raised to different levels at different temperatures, the transistor T3 is turned on to different level, so that the output signal SOUT generated by the transistor T3 will also change according to the operating temperature of the semiconductor device 124. The curve C33 corresponds to the curve C31 and a relatively low temperature, and the curve C34 corresponds to the curve C32 and a relatively high temperature. The pixel circuit 100 can use an additional integrated circuit to obtain information regarding the operating temperature of the semiconductor device 124 according to the output signals SOUT as shown by the curves C33-C34.

In some embodiments, after the frame $F_{N+1}$, the pixel circuit 100 operates in the photo-sensing period during the frame $F_{N+2}$ again. During the frame $F_{N+2}$, the signals of the pixel circuit 100 have time sequences similar to the signals during the frame $F_N$, and the components of the pixel circuit 100 operate in a way similar to how they operate during the frame $F_N$. The curve C41 corresponds to the curve C21, the curve C42 corresponds to the curve C22, the curve C43 corresponds to the curve C23, and the curve C44 corresponds to the curve C24.

Figure 5A:
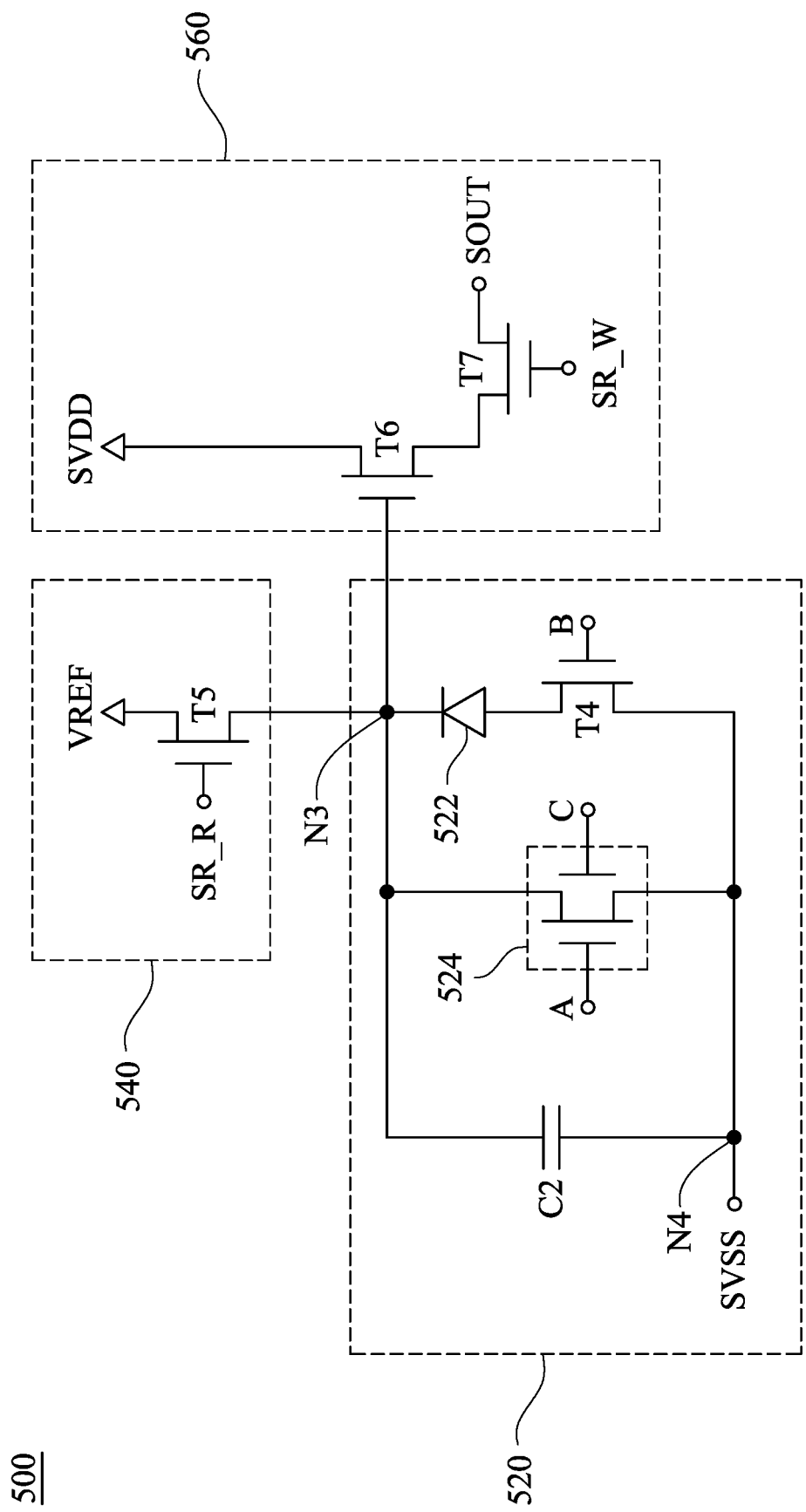
FIG. 5A is a circuit diagram of a pixel circuit in accordance with various embodiments of the present disclosure.

Reference is now made to FIG. 5A. FIG. 5A is a circuit diagram of a pixel circuit 500 in accordance with various embodiments of the present disclosure. The pixel circuit 500 includes a sensing circuit 520, a reset circuit 540, and a signal amplifying circuit 560. The sensing circuit 520 is coupled between nodes N3-N4, the reset circuit 540 is coupled between a reference voltage terminal providing the reference voltage VREF and the node N3, and the signal amplifying circuit 560 is coupled between a reference voltage terminal providing the reference voltage SVDD and the node N3.

For illustration of FIG. 5A, the sensing circuit 520 includes a photo-sensing component 522, a transistor T4, a semiconductor device 524, and a capacitor C2. The reset circuit 540 includes a transistor T5. The signal amplifying circuit 560 includes transistors T6-T7.

For illustration of FIGS. 1 and 5, the pixel circuit 500 has components similar to the ones that the pixel circuit 100 has, and their components have similar connecting relationships. The sensing circuit 520 corresponds to the sensing circuit 120, the reset circuit 540 corresponds to the reset circuit 140, and the signal amplifying circuit 560 corresponds to the signal amplifying circuit 160. The photo-sensing component 522 corresponds to the photo-sensing component 122, the transistor T4 corresponds to the transistor T1, the semiconductor device 524 corresponds to the semiconductor device 124, and the capacitor C2 corresponds to the capacitor C1. The transistor T5 corresponds to the transistor T2. The transistor T6 corresponds to the transistor T3.

The difference between the pixel circuits 100 and 500 is that the signal amplifying circuit 560 of the pixel circuit 500 further includes a transistor T7. The transistor T7 is configured to control when to output the voltage level at the second terminal of the transistor T6 as the output signal SOUT. The first terminal of the transistor T7 is coupled to the second terminal of the transistor T6. The gate terminal of the transistor T7 is configured to receive the control signal SR_W. The second terminal of the transistor T7 is configured to output the output signal SOUT. In addition, because the pixel circuit 500 uses the transistor T7 to control when to output the output signal SOUT, the second terminal of the capacitor C2 is adjusted to receive a fixed reference voltage SVSS, and the first terminal of the transistor T5 is adjusted to receive the reference voltage VREF.

Figure 5B:
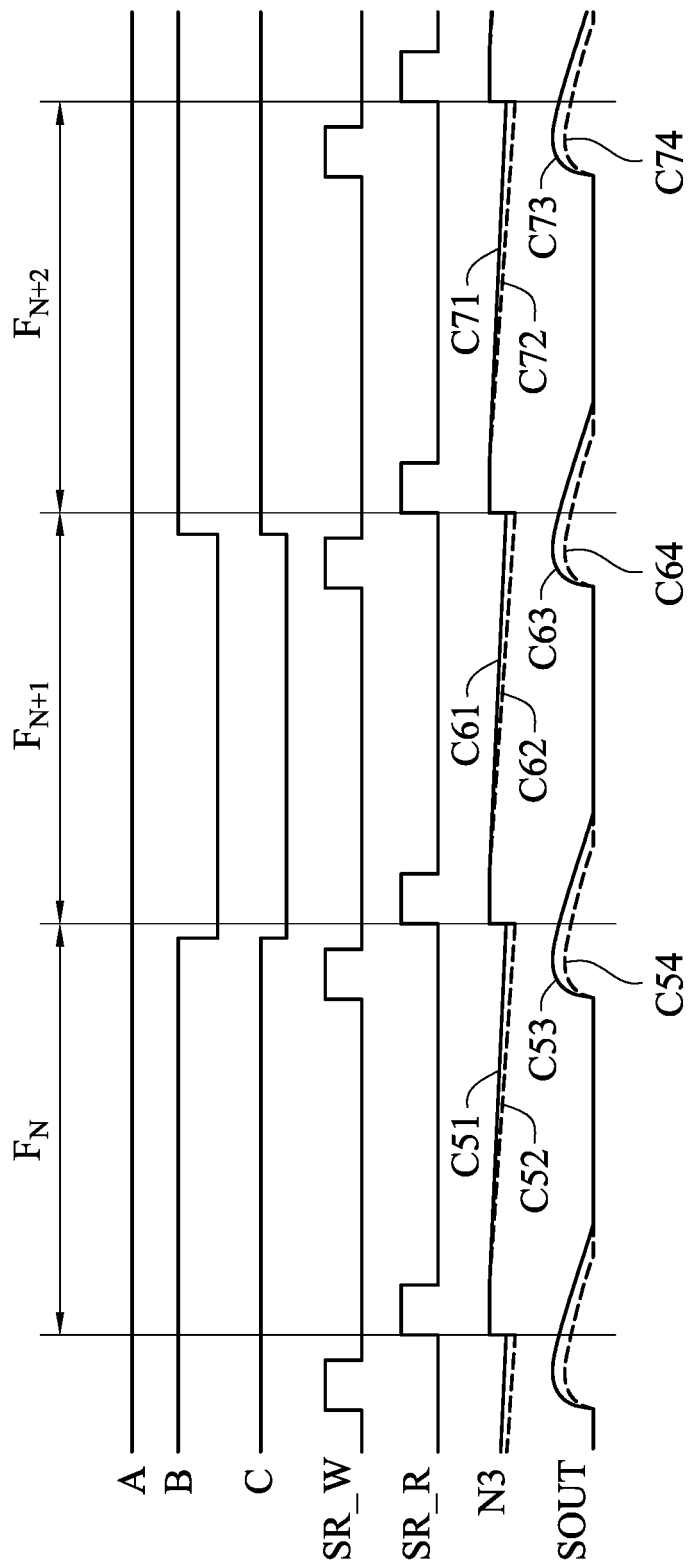
FIG. 5B is a sequence diagram for signals of the pixel circuit as shown in FIG. 5A in accordance with some embodiments of the present disclosure.

Reference is now made to FIGS. 5A-5B. FIG. 5B is a sequence diagram for signals of the pixel circuit 500 as shown in FIG. 5A in accordance with some embodiments of the present disclosure. The pixel circuit 500 operates in frames $F_N$, $F_{N+1}$, and $F_{N+2}$ in a sequential order. Voltage levels of the control signals A, B, C, SR_W, SR_R, the node N3, and the output signal SOUT in different frames are illustrated in FIG. 5B.

In some embodiments, during the frames $F_N$, $F_{N+1}$, and $F_{N+2}$, the pixel circuit 500 operates in the photo-sensing period, the temperature-sensing period, and the photo-sensing period respectively. In addition, the control signals A, B, C in FIG. 5B are the same as the control signals A, B, C in FIG. 4, and the operations of the transistor T4 and the semiconductor device 524 in the pixel circuit 500 are the same as their counterparts in the pixel circuit 100.

Following the embodiments above, during the frame $F_N$, when the control signal SR_R has a high logic level, the transistor T5 is turned on and is configured to transmit the reference voltage VREF to the node N3 and the first terminal of the capacitor C2. Accordingly, the transistor T5 of the reset circuit 540 resets the voltage level of the node N3 according to the reference voltage VREF, so that the node N3 and the reference voltage VREF have the same voltage levels. In addition, the transistor T5 charges the capacitor C2 according to the reference voltage VREF as well.

Following the embodiments above, during the frame $F_N$, after the reset circuit 540 resets the voltage level of the node N3, as shown by curves C51-C52, the voltage level of the node N3 starts to decrease slowly. The curve C51 indicates the change of the voltage level of the node N3 when the photo-sensing component 522 receives the light with relatively low intensity, and the curve C52 indicates the change of the voltage level of the node N3 when the photo-sensing component 522 receives the light with relatively high intensity. The curve C52 falls at a relatively high speed and has a relatively large decrease, and the curve C51 falls at a relatively low speed and has a relatively small decrease. The curve C52 corresponds to a larger current of the photo-sensing component 522, and the curve C51 corresponds to a smaller current of the photo-sensing component 522.

In some embodiments, after the reset circuit 540 resets the voltage level of the node N3 and during the period when the voltage level of the node N3 falls slowly, the gate of the transistor T6 receives the voltage level of the node N3 and the transistor T6 is turned on. However, because the transistor T7 is turned off, the output signal SOUT will not be transmitted by the transistor T7.

Following the embodiments above, during the frame $F_N$, after the voltage level of the node N3 falls for a certain period, the voltage level of the control signal SR_W is raised from logic low to logic high. The transistor T7 is turned on, and its second terminal outputs the output signal SOUT. In some embodiments, as shown by the curves C51-C52, because the voltage levels at the node N3 fall to different levels according to the intensities of the current generated by the photo-sensing component 522, when the transistor T7 is turned on, the output signal SOUT will have different levels. The curve C53 corresponds to the curve C51 and a relatively low intensity of light, and the curve C54 corresponds to the curve C52 and a relatively high intensity of light.

In some embodiments, during the frame $F_{N+1}$, the pixel circuit 500 operates in the temperature-sensing period. The control signals SR_W and SR_R during the frame $F_{N+1}$ and the control signals SR_W and SR_R during the frame $F_N$ have similar time sequences. Accordingly, similar to the operations regarding the transistor T5 in the reset circuit 540 and the transistor T7 in the signal amplifying circuit 560 described in previous embodiments, when the control signal SR_R is logic high, the transistor T5 resets the signal at the node N3 according to the reference voltage VREF. When the control signal SR_W is raised to logic high, the transistor T7 is configured to output the output signal SOUT.

Following the embodiments above, different from the frame $F_N$, during the frame $F_{N+1}$, the voltage level of the node N3 falls slowly because of the current of the semiconductor device 524. The curve C61 indicates the change of the voltage level of the node N3 when the semiconductor device 524 operates at a relatively low temperature, and the curve C62 indicates the change of the voltage level of the node N3 when the semiconductor device 524 operates at a relatively high temperature. The curve C62 corresponds to a higher temperature, and the larger current makes the voltage level of the node N3 fall toward the reference voltage SVSS at a higher speed. The curve C61 corresponds to a lower temperature, and the smaller current makes the voltage level of the node N3 fall toward the reference voltage SVSS at a lower speed.

Following the embodiments above, during the frame $F_{N+1}$, after the voltage level of the node N3 falls for a certain period, the voltage level of the control signal SR_W is raised from logic low to logic high. The transistor T7 is turned on, and its second terminal outputs the output signal SOUT. In some embodiments, as shown by the curves C61-C62, because the voltage levels at the node N3 fall to different levels according to the intensities of the current generated by the semiconductor device 524, when the transistor T7 is turned on, the output signal SOUT will have different levels. The curve C63 corresponds to the curve C61 and a lower temperature, and the curve C64 corresponds to the curve C62 and a higher temperature. The pixel circuit 500 can use an additional integrated circuit to obtain information regarding the operating temperature of the semiconductor device 524 according to the output signals SOUT as shown by the curves C63-C64.

In some embodiments, after the frame $F_{N+1}$, the pixel circuit 500 operates in the photo-sensing period during the frame $F_{N+2}$ again. During the frame $F_{N+2}$, the signals of the pixel circuit 500 have time sequences similar to the signals during the frame $F_N$, and the components of the pixel circuit 500 operate in a way similar to how they operate during the frames $F_N$ and $F_{N+1}$. The curve C71 corresponds to the curve C51, the curve C72 corresponds to the curve C52, the curve C73 corresponds to the curve C53, and the curve C74 corresponds to the curve C54.

Figure 6A:
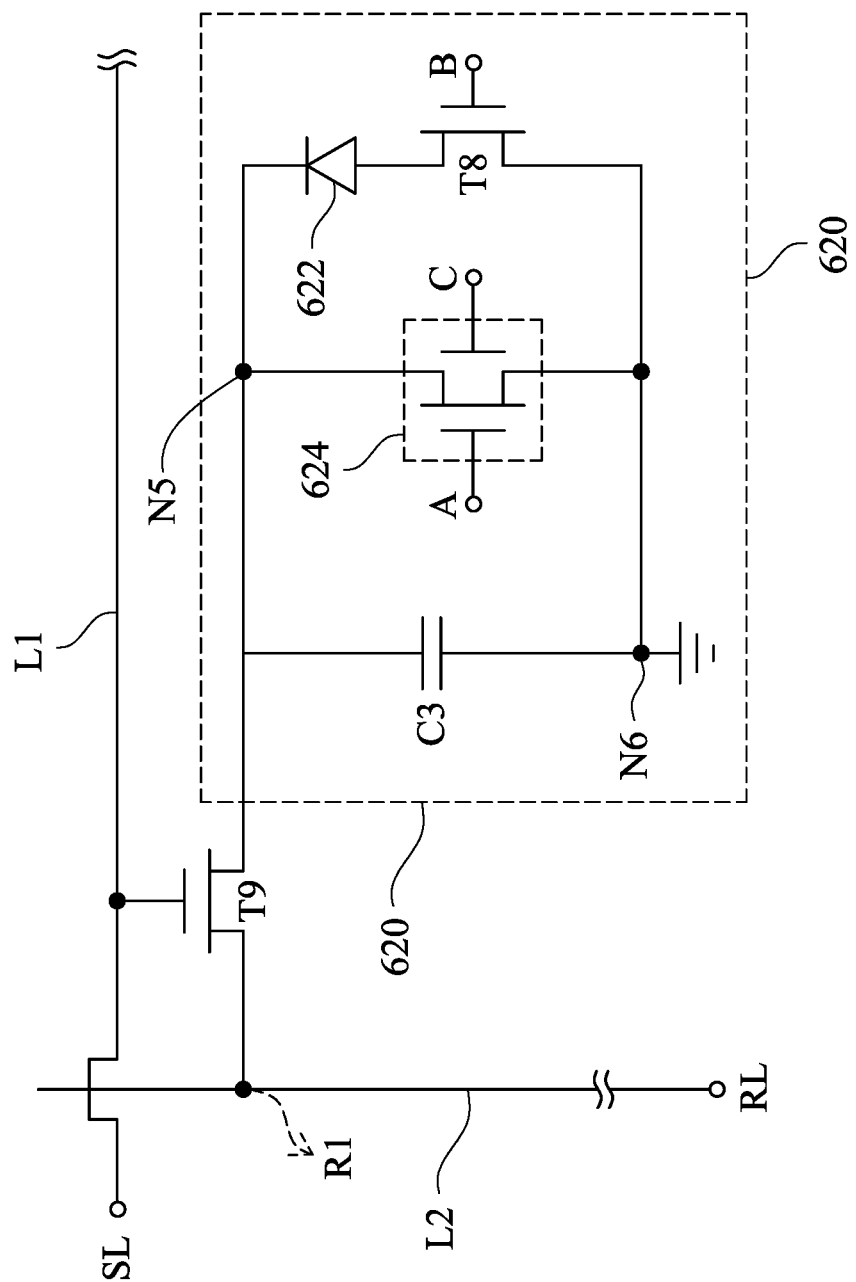
FIG. 6A is a circuit diagram of a pixel circuit in accordance with various embodiments of the present disclosure.

Reference is now made to FIG. 6A. FIG. 6A is a circuit diagram of a pixel circuit 600 in accordance with various embodiments of the present disclosure. The pixel circuit 600 includes a sensing circuit 620, a transistor T9, a control line L1, and a data line L2. The sensing circuit 620 is coupled between the nodes N5-N6. A first terminal of the transistor T9 is coupled to the node N5, a second terminal of the transistor T9 is coupled to the data line L2, and a gate terminal of the transistor T9 is coupled to the data line L1.

In some embodiments, the pixel circuit 600 is used in a passive matrix display, and the voltage level of the node N5 in the sensing circuit 620 is read or written through the control line L1 and the data line L2.

For illustration of FIG. 6A, the sensing circuit 620 includes a photo-sensing component 622, a transistor T8, a semiconductor device 624, and a capacitor C3.

For illustration of FIGS. 1 and 6A, the pixel circuit 600 has components similar to the ones in the pixel circuit 100, and the components of the pixel circuits 100 and 600 have similar connecting relationships. The photo-sensing component 622 corresponds to the photo-sensing component 122, the transistor T8 corresponds to the transistor T1, the semiconductor device 624 corresponds to the semiconductor device 124, and the capacitor C3 corresponds to the capacitor C1.

Figure 6B:
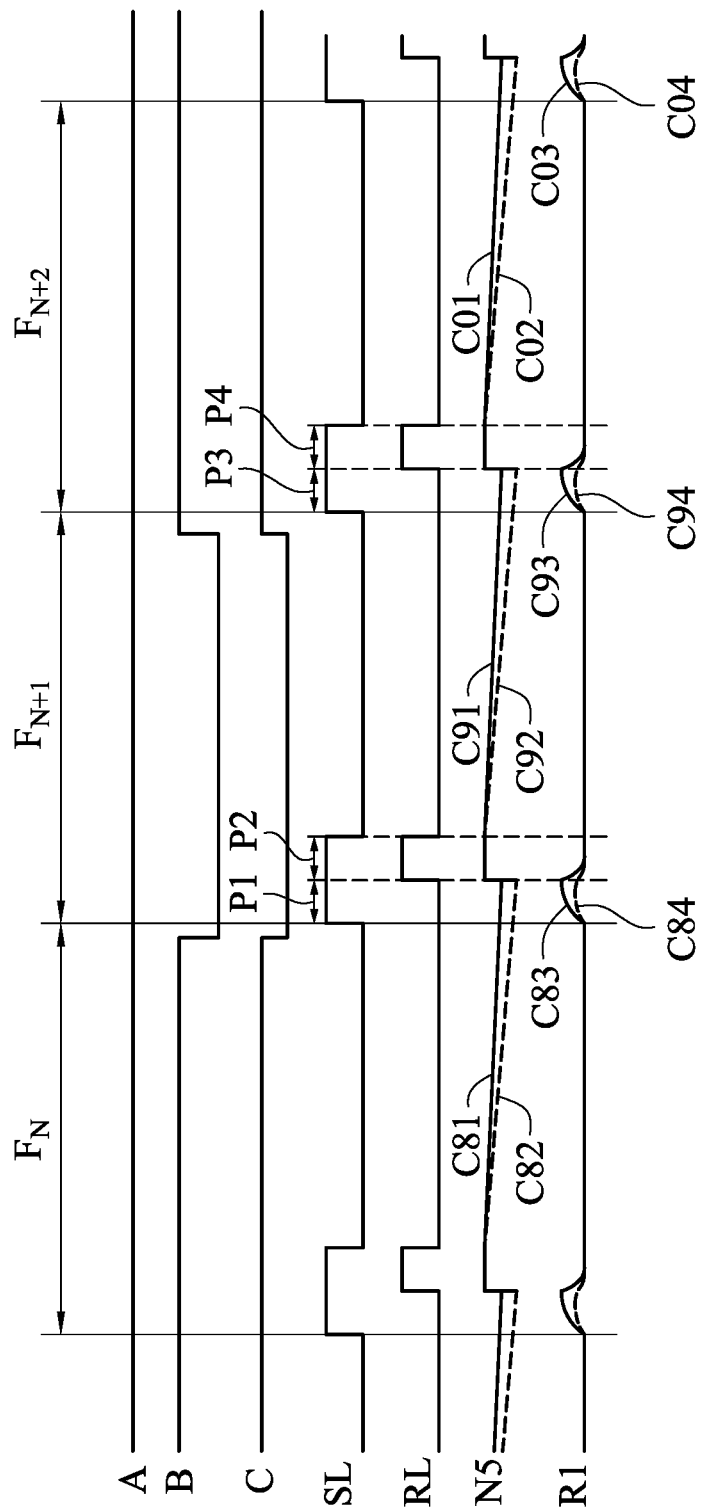
FIG. 6B is a sequence diagram for signals of the pixel circuit as shown in FIG. 6A in accordance with some embodiments of the present disclosure.

Reference is now made to FIGS. 6A-6B. FIG. 6B is a sequence diagram for signals of the pixel circuit 600 as shown in FIG. 6A in accordance with some embodiments of the present disclosure. The pixel circuit 600 operates in frames $F_N$, $F_{N+1}$, and $F_{N+2}$ in a sequential order. Voltage levels of the control signals A, B, C, SL, RL, the node N5, and the output signal R1 in different frames are illustrated in FIG. 6B.

In some embodiments, during the frames $F_N$, $F_{N+1}$, and $F_{N+2}$, the pixel circuit 600 operates in the photo-sensing period, the temperature-sensing period, and the photo-sensing period respectively. In addition, the control signals A, B, C in FIG. 6B are the same as the control signals A, B, C in FIG. 4, and the operations of the transistor T8 and the semiconductor device 624 in the pixel circuit 600 are the same as their counterparts in the pixel circuit 100.

Following the embodiments above, during the frame $F_N$, when the control signals SL and RL have high logic levels, the control signal SL is transmitted to the gate of the transistor T9 through the control line L1, and the control signal RL is transmitted to the second terminal of the transistor T9 through the data line L2. The transistor T9 is turned on, and the high voltage level of the control signal RL is transmitted to the node N5 and the first terminal of the capacitor C3. Accordingly, the transistor T9 is configured to reset the voltage level of the node N5 according to the control signal RL, so that the node N5 and the control signal RL have the same voltage levels. In addition, the transistor T9 charges the capacitor C3 according to the control signal RL.

Following the embodiments above, during the frame $F_N$, after the transistor T9 resets the voltage level of the node N5, as shown by curves C81-C82, the voltage level of the node N5 starts to decrease slowly. The curve C81 indicates the change of the voltage level of the node N5 when the photo-sensing component 622 receives the light with low intensity, and the curve C82 indicates the change of the voltage level of the node N5 when the photo-sensing component 622 receives the light with high intensity. The curve C82 falls at a relatively high speed and has a relatively large decrease, and the curve C81 falls at a relatively low speed and has a relatively small decrease. The curve C82 corresponds to a larger current of the photo-sensing component 622, and the curve C81 corresponds to a smaller current of the photo-sensing component 622.

In some embodiments, after the voltage level of the node N5 starts to decrease slowly and before the frame $F_N$ ends, the control signals SL and RL have low voltage levels, and the transistor T9 is turned off.

In some embodiments, during the frame $F_{N+1}$, the pixel circuit 600 reads the voltage level of the node N5, resets the voltage level of the node N5, and then starts to perform temperature sensing. The control signals SL and RL during the frame $F_{N+1}$ and the control signals SL and RL during the frame $F_N$ have similar time sequences.

In some embodiments, during a period P1 in the frame $F_{N+1}$, the control signal SL is raised from low voltage level to high voltage level, and the control signal RL is kept at low voltage level. The transistor T9 is turned on, so that the voltage level of the node N5 is output as the output signal R1 through the transistor T9. The output signal R1 is transmitted through the data line RL. Accordingly, the pixel circuit 600 obtains the photo-sensing signal. In some embodiments, as shown by the curves C81-C82, because the voltage levels at the node N5 fall to different levels according to the intensities of the current generated by the photo-sensing component 622 during the frame $F_N$, when the transistor T9 is turned on, the output signal R1 will have different levels. The curve C83 corresponds to the curve C81 and a lower light intensity, and the curve C84 corresponds to the curve C82 and a higher light intensity.

In some embodiments, during a period P2 in the frame $F_{N+1}$, the control signal SL is kept at high voltage level, and the control signal RL is raised from low voltage level to high voltage level. The high voltage level of the control signal RL is transmitted to the node N5 and the first terminal of the capacitor C3 through the transistor T9 that is turned on. Accordingly, the transistor T9 resets the voltage level of the node N5 according to the control signal RL, so that the node N5 and the control signal RL have the same voltage level. In addition, the transistor T9 charges the capacitor C3 according to the control signal RL.

Following the embodiments above, after the period P2 in the frame $F_{N+1}$, as shown by the curves C91-C92, the voltage level of the node N5 starts to decrease slowly. Different from the frame $F_N$, the voltage level of the node N5 falls slowly because of the current of the semiconductor device 624. The curve C91 indicates the change of the voltage level of the node N5 when the semiconductor device 624 operates at a relatively low temperature, and the curve C92 indicates the change of the voltage level of the node N5 when the semiconductor device 624 operates at a relatively high temperature. The curve C92 corresponds to a higher temperature, and the larger current makes the voltage level of the node N5 fall toward the ground voltage level received at the node N5 at a higher speed. The curve C91 corresponds to a lower temperature, and the smaller current makes the voltage level of the node N5 fall toward the ground voltage level received at the node N5 at a lower speed.

In some embodiments, after the voltage level of the node N5 starts to decrease slowly and before the frame $F_{N+1}$ ends, the control signals SL and RL have low voltage levels, and the transistor T9 is turned off.

In some embodiments, similarly, in the frame $F_{N+2}$, the sensing circuit 620 reads the voltage level of the node N5 during a period P3, resets the voltage level of the node N5 during a period P4, and then starts to perform photo-sensing. Signals of the pixel circuit 600 have similar time sequences during the frames $F_{N+2}$ and $F_N$. The curve C01 corresponds to the curve C81, the curve C02 corresponds to the curve C82, the curve C03 corresponds to the curve C83, and the curve C04 corresponds to the curve C84.

In conclusion, the pixel circuits 100, 500, and 600 disclosed in the present disclosure are able to perform photo-sensing through the photo-sensing components 122, 522, and 622 and perform temperature-sensing through the semiconductor devices 124, 524, and 624, and utilize the temperature-sensing signals to adjust the photo-sensing signals. In addition, because the bottom gates of the semiconductor devices 124, 524, and 624 are able to control the currents of the semiconductor devices 124, 524, and 624 when they operate in the off state, the semiconductor devices 124, 524, and 624 are configured as switch components during the photo-sensing period and configured as temperature-sensing components during the temperature-sensing period.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A sensing circuit, comprising:
   a photo-sensing component, configured to receive a light and transmit a first current according to an intensity of the light;
   a first transistor, a gate terminal of the first transistor being configured to receive a first control signal, wherein the photo-sensing component and the first transistor are coupled in series between a first node and a second node; and
   a temperature-sensing component, coupled between the first node and the second node and configured to generate a second current according to a temperature, the temperature-sensing component comprising:
  a channel structure, configured to transmit the second current;
  a first gate, arranged above the channel structure and configured to control the channel structure to operate in an off state according to a second control signal;
  a second gate, arranged below the channel structure and configured to control an intensity of the second current in the channel structure according to a third control signal; and
  a light-shielding structure, arranged above the first gate and configured to shield the light coming from above the temperature-sensing component.

2. The sensing circuit of claim 1, further comprising:
a capacitor, coupled between the first node and the second node;
wherein, during a photo-sensing period, the first transistor is turned on, and the second gate of the temperature-sensing component is configured to control the second current in the channel structure according to the third control signal; and
during a temperature-sensing period, the first transistor is turned off, and the second gate of the temperature-sensing component is configured to control the second current in the channel structure according to the third control signal;
wherein the second current during the photo-sensing period is smaller than the second current during temperature-sensing period.

3. The sensing circuit of claim 1, further comprising:
a second transistor, a first terminal of the second transistor being configured to receive a first reference voltage, a second terminal of the second transistor being coupled to the first node, a gate terminal of the second transistor being configured to receive a fourth control signal.

4. The sensing circuit of claim 3, further comprising:
a third transistor, a first terminal of the third transistor being configured to receive a second reference voltage, a gate terminal of the third transistor being configured to receive a voltage level of the first node.

5. The sensing circuit of claim 4, further comprising:
a fourth transistor, a first terminal of the fourth transistor being coupled to a second terminal of the third transistor, a gate terminal of the fourth transistor being configured to receive a fifth control signal.

6. The sensing circuit of claim 1, further comprising:
a second transistor, a first terminal of the second transistor being coupled to the first node, a gate terminal of the second transistor being coupled to a control line, a second terminal of the second transistor being coupled to a data line.

7. The sensing circuit of claim 1, wherein
in response to the temperature, the temperature-sensing component is further configured to generate the second current;
wherein when the temperature is increased, the second current is increased.

8. The sensing circuit of claim 1, wherein
the channel structure is an N-type channel;
in response to a voltage level of the third control signal being negative, the second gate is further configured to control the second current in the channel structure;
wherein the second current at a negative voltage level is larger than the second current at a positive voltage level.

9. The sensing circuit of claim 8, wherein
in response to the second current al the negative voltage level, the temperature-sensing component is configured as a switch component.

10. The sensing circuit of claim 1, further comprising:
a second transistor, a first terminal of the second transistor being coupled to a first reference voltage terminal, a second terminal of the second transistor being coupled to the first node, a gate terminal of the second transistor being configured to receive a fourth control signal.

11. The sensing circuit of claim 1, further comprising:
a second transistor, a first terminal of the second transistor being coupled to a first reference voltage terminal, a gate terminal of the second transistor being configured to receive a voltage level of the first node.

12. The sensing circuit of claim 11, further comprising:
a third transistor, a first terminal of the third transistor being coupled to a second terminal of the second transistor, a gate terminal of the third transistor being configured to receive a fourth control signal.

13. A pixel circuit, comprising:
a sensing circuit, comprising:
  a semiconductor device, coupled between a first node and a second node, the semiconductor device comprising:
    a channel structure, configured to transmit a first current;
    a first gate, arranged above the channel structure and configured to control the channel structure to operate in an off state according to a first control signal;
    a second gate, arranged below the channel structure and configured to control an intensity of the first current in the channel structure according to a second control signal; and
    a light-shielding structure, arranged above the first gate and configured to shield a light coming from above the semiconductor device;
  wherein, in response to the second gate controlling the first current in the channel structure, the semiconductor device is configured as a temperature-sensing component; and
  in response to the second gate controlling the first current in the channel structure, the semiconductor device is configured as a switch component,
  wherein the first current in a first period that the semiconductor device is configured as the temperature-sensing component is larger than the first current in a second period that the semiconductor device is configured as the switch component.

14. The pixel circuit of claim 13, wherein the sensing circuit further comprises:
a photo-sensing component, configured to receive the light and transmit a second current according to an intensity of the light.

15. The pixel circuit of claim 14, wherein the sensing circuit further comprises:
a first transistor, a gate terminal of the first transistor being configured to receive a third control signal, wherein the photo-sensing component and the first transistor are coupled in series between the first node and the second node; and
a capacitor, coupled between the first node and the second node.

16. The pixel circuit of claim 15, wherein the sensing circuit further comprises:
a second transistor, a first terminal of the second transistor being coupled to the first node, a gate terminal of the second transistor being configured to receive a fourth control signal, a second terminal of the second transistor being configured to receive a fifth control signal;

wherein, in response to the fourth and fifth control signals having high logic levels, the second transistor is configured to reset a voltage level of the first node according to the fifth control signal.

17. The pixel circuit of claim 13, further comprising:

a reset circuit, coupled between a first reference voltage terminal and the first node and configured to reset a voltage level of the first node according to a first reference voltage of the first reference voltage terminal; and a signal amplifying circuit, coupled between a second reference voltage terminal and the first node and configured to generate an output signal according to a second reference voltage of the second reference voltage terminal and the voltage level of the first node.

18. The pixel circuit of claim 17, wherein the reset circuit further comprises:

a first transistor, a first terminal of the first transistor being coupled to the first reference voltage terminal, a second terminal of the first transistor being coupled to the first node, a gate terminal of the first transistor being configured to receive a third control signal.

19. The pixel circuit of claim 17, wherein the signal amplifying circuit further comprises:

a first transistor, a first terminal of the first transistor being coupled to the first reference voltage terminal, a gate terminal of the first transistor being configured to receive the voltage level of the first node.

20. The pixel circuit of claim 19, wherein the signal amplifying circuit further comprises:

a second transistor, a first terminal of the second transistor being coupled to a second terminal of the first transistor, a gate terminal of the second transistor being configured to receive a third control signal.

* * * * *